United States Patent [19]

Majumdar et al.

[11] Patent Number: 4,672,245
[45] Date of Patent: Jun. 9, 1987

[54] HIGH FREQUENCY DIVERSE SEMICONDUCTOR SWITCH

[75] Inventors: Gourab Majumdar; Satoshi Mori, both of Itami, Japan

[73] Assignee: Mitsubishi Denki Kabushiki Kaisha, Tokyo, Japan

[21] Appl. No.: 764,591

[22] Filed: Aug. 9, 1985

[30] Foreign Application Priority Data

Oct. 30, 1984 [JP] Japan .................. 59-230614

[51] Int. Cl.⁴ .................... H03K 17/60; H03K 17/687
[52] U.S. Cl. ..................................... 307/570; 307/544; 307/574
[58] Field of Search ................ 307/570, 574, 544, 571

[56] References Cited

U.S. PATENT DOCUMENTS

| | | | |
|---|---|---|---|
| 3,417,260 | 12/1968 | Foster, Jr. | 307/319 |
| 4,551,643 | 11/1985 | Russel et al. | 307/570 |
| 4,604,535 | 8/1986 | Sasayama et al. | 307/570 |

FOREIGN PATENT DOCUMENTS

| | | |
|---|---|---|
| 1144766 | 9/1963 | Fed. Rep. of Germany . |
| 3044842 | 7/1982 | Fed. Rep. of Germany . |
| 3030485 | 8/1982 | Fed. Rep. of Germany . |
| 1140667 | 1/1969 | United Kingdom . |

OTHER PUBLICATIONS

"A Comparison Between BIMOS Device Types", M. S. Adler, IEEE Power Electronics Specialists Conference, Jun. 1982, pp. 371-377.
"A New BIMOS Switching Stage for 10 KW Range", E. Hebenstreit, PCI, Apr. 1983 Proceedings, pp. 140-145.
"Status and Emerging Directions of MOSPOWER Technology", Dr. Richard Blanchard, PCI, Apr. 1983 Proceedings, pp. 162-174.

Primary Examiner—Stanley D. Miller
Assistant Examiner—B. P. Davis
Attorney, Agent, or Firm—Lowe Price LeBlanc Becker & Shur

[57] ABSTRACT

Provided is a power semiconductor device operable to be switched at high frequencies. The semiconductor device according to the present invention is applied to a three-terminal BIMOS power semiconductor device in which a MOS-FET (2) is connected in parallel with a bipolar transistor (3) while the gate of the MOS-FET (2) is connected with the base of the bipolar transistor (3) through a reference-voltage diode (6) and a fast switching diode (7) so that the operation of the semiconductor device can be controlled by one driving circuit (1).

4 Claims, 2 Drawing Figures

HIGH FREQUENCY DIVERSE SEMICONDUCTOR SWITCH

BACKGROUND OF THE INVENTION

1. Field of the Invention

The present invention relates to a semiconductor device, and more particularly, it relates to the circuit arrangement of a power semiconductor device with three terminals operable to be switched at high frequencies.

2. Description of the Prior Art

FIG. 2 shows the circuit arrangement of a conventional BIMOS switching power semiconductor device with four terminals operable to be switched at high frequencies.

Referring to FIG. 2, an n-channel MOS field effect transistor (MOS-FET) 2 is connected in parallel with an npn-type bipolar transistor 3. Namely, the drain of the n-channel MOS-FET 2 is connected with the collector of the npn-type bipolar transistor 3 and the source of the MOS-FET 2 is connected with the emitter of the bipolar transistor 3, to form a C/D terminal and an E/S terminal respectively. Between the C/D terminal and the E/S terminal, a free-wheeling diode 4 is connected in an electrically forward direction in view of the E/S terminal. To the gate of MOS-FET 2 is provided a voltage pulse from a gate driving power suuply 1, and to the base of the bipolar transistor is provided a current pulse from a base current supply 5. The operation of the MOS-FET 2 is controlled by voltage pulses from the power supply 1 for driving the gate of the MOS-FET 2 while the operation of the bipolar transistor 3 is controlled by current signals from the base current supply 5.

Refering to FIG. 2, first, a turn-on operation of the semiconductor device circuit is described. The MOS-FET 2 is turned on by the voltage pulse supplied to its gate from the gate-driving power supply 1. In synchronization with the base-driving voltage pulse from the power supply 1, the base current supply 5 supplies the base-driving current pulse to the base of the bipolar transistor 3 to turn on the same. Thus, the MOS-FET 2 and the bipolar transistor 3 perform parallel switching operations. The switching rate of the MOS-FET 2 is faster than that of the bipolar transistor 3, and hence the load current $I_L$ flowing from the C/D terminal is first bypassed by the MOS-FET 2 to flow out from the E/S terminal. When the bipolar transistor 3 is turned on and saturated, the current flowing from the C/D terminal to the E/S terminal is divided in accordance with the ratio between the collector-to-emitter saturation resistance of the bipolar transistor 3 to the drain-to-source on-resistance of the MOS-FET 2.

In order to turn off the semiconductor device, the pulses from the power supply 1 and the current supply 5 are made negative so that the MOS-FET 2 and the bipolar transistor 3 are turned off. A high-speed switching operation of the conventional semiconductor device has been performed in the aforementioned manner.

However, the aforementioned conventional semiconductor device with four terminals for parallel BIMOS switching operations has the following disadvantages: First, the conventional semiconductor device requires two driving circuits such as the power supply 1 for driving the MOS gate and the current supply 5 for driving the base of the bipolar transistor 2 as shown in FIG. 2, and the respective driving circuits must be enlarged in size as they are. The enlargement in size of the driving circuits accompanies the increased driving loss therein, and the entire system is also enlarged in size.

Further, the output current pulse from the base current supply 5 must be matched in timing with the output voltage pulse from the gate-driving power supply 1 as the condition required for the two driving supplies 1 and 5 to make the parallel operations of the MOS-FET 2 and the bipolar transistor 3. However, such matching is considerably difficult and a time lag may be caused in the timing of on/off operations of the MOS-FET 2 and the bipolar transistor 3.

Further, since the bipolar transistor 3 operates in a general switching character, i.e., in a saturation region, the storage time of the bipolar transistor 3 may attain to several $\mu$sec. depending on driving conditions, causing a delay in response in the switching operation at high frequencies.

In addition, when the bipolar transistor 3 is turned off, a reverse bias is applied to its base from the base current supply 5, whereby the base current may flow in the reverse direction to exceed the limit value of the reverse bias safe operating area of the bipolar transistor 3 (particularly in case of an inductive load), thereby to damage the bipolar transistor 3. Thus, narrowed is the range of the reverse bias safe operating area of the switching semiconductor device.

Accordingly, an object of the present invention is to overcome the aforementioned disadvantages of the prior art by providing a three-terminal switching semiconductor device of BIMOS structure which can implement an inverter unit or a chopper unit safely operating preferably in a high-frequency region exceeding 100 KHz.

The circuit according to the present invention can be easily put into practice by employing components which easily come to hand and simple circuit arrangement with no employment of components hard to obtain nor complicated circuit arrangement.

Examples of the conventional semiconductor devices operable to be switched at high speed and frequencies are described in detail in "A Comparison between BIMOS Device Types" by M. S. Adler, IEEE Power Electronics Specialists Conference, June 1982, "A New BIMOS Switching Stage for 10 KW Range" by E. Heberstreit, PCI April 1983 Proceedings and "Status and Emerging Directions of MOSPOWER Technology" by Dr. Blanchard, PCI April 1983 Proceedings.

SUMMARY OF THE INVENTION

The semiconductor device according to the present invention provides a power semiconductor device of three-terminal BIMOS structure, the operation of which is driven by a single driving source with its bipolar transistor being adapted to operate in a nonsaturation region (quasi-saturation or active operation region).

In definite terms, the semiconductor device according to the present invention comprises a MOS-FET and a bipolar transistor in a parallel combination, in which the gate of the MOS-FET is connected with the base of the bipolar transistor through a voltage-to-current converting diode.

The voltage-to-current converting diode is preferably formed by a series-connected body of a reference-voltage diode in an electrically reverse direction and a fast switching diode in an electrically forward direction in view of the gate of the MOS-FET. Further, a second fast switching diode is connected in parallel with the series-connected body in the electrically reverse direction in view of the gate of the MOS-FET.

The voltage signal from the driving circuit is supplied to the gate of the MOS-FET and the junction between the source of the MOS-FET and the emitter of the bipolar transistor.

The switching power semiconductor device in the above structure has the following advantages:

The MOS-FET and the bipolar transistor are driven by the same driving circuit, whereby no means is required to match the timing of driving signals, while driving loss is reduced and the entire semiconductor device can be miniaturized.

Further, by virtue of the two diodes connected in series with each other, the bipolar transistor is turned on in a delay to the MOS-FET to operate in the above said nonsaturation region, whereby the storage time is remarkably reduced and the reverse bias safe operating area is widened.

The above and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
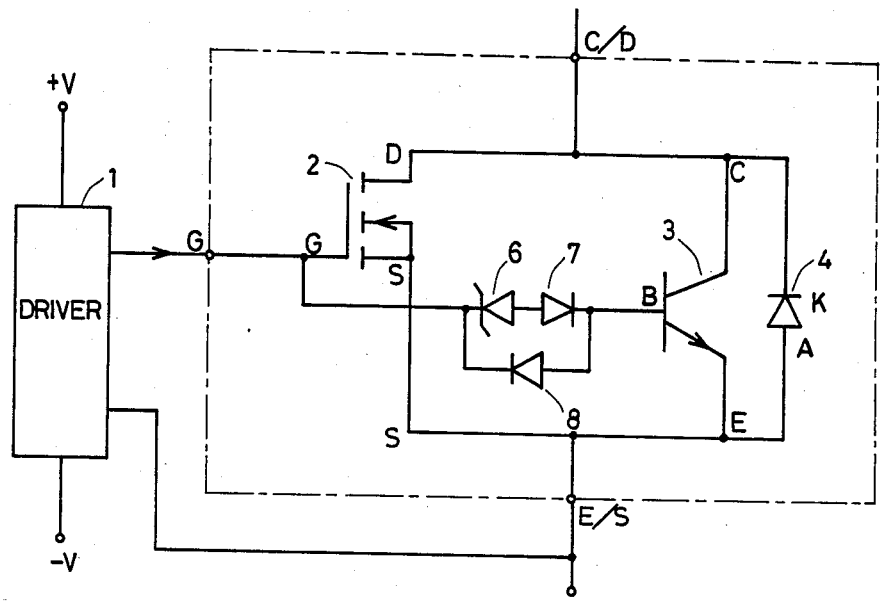
FIG. 1 illustrates the circuit arrangement of a BIMOS semiconductor device with three terminals operable to be switched at high frequencies.
Figure 2:
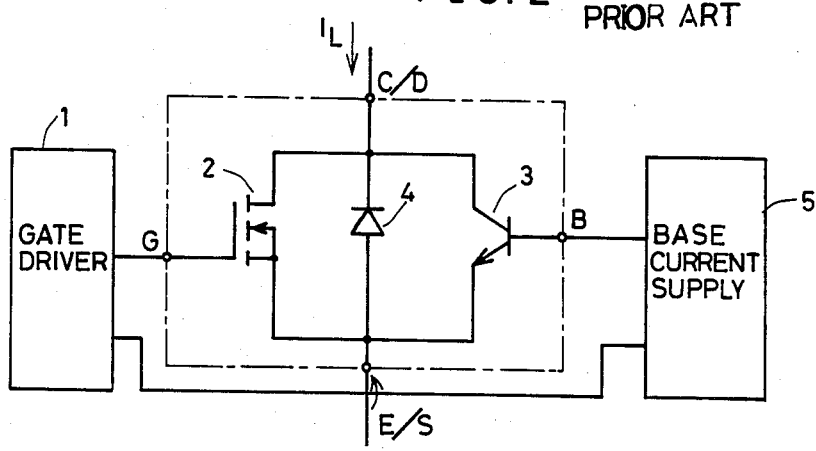
FIG. 2 is a circuit diagram showing a conventional parallel BIMOS semiconductor device with four terminals operable to be switched at high frequencies.

FIG. 1 is a circuit diagram of a semiconductor device according to an embodiment of the present invention. In FIG. 1, the drain (first electrode) of an n-channel MOS-FET 2 is connected with the collector (fourth electrode) of an npn-type bipolar transistor 3 to form a C/D terminal and the source (second electrode) of the MOS-FET 2 is connected with the emitter (fifth electrode) of the bipolar transistor 3 to form an E/S terminal. The emitter of the bipolar transistor 3 is connected with the anode of a commutating freewheeling diode 4 and the collector of the bipolar transistor 3 is connected with the cathode of the freewheeling diode 4 respectively.

The feature of the present invention resides in that both of the MOS-FET 2 and the bipolar transistor 3 are driven by a driving circuit 1, signals from which are supplied between the gate (control electrode) of the MOS-FET 2 and the E/S terminal. Provided between the gate of the MOS-FET 2 and the base of the bipolar transistor 3 is a diode circuit in the following structure: The gate of the MOS-FET 2 is connected with the cathode of a Zener diode 6 for supplying threshold voltage to the MOS-FET 2 and the anode of the Zener diode 6 is connected with the anode of a fast switching diode 7 while the cathode of the fast switching diode 7 is connected with the base of the bipolar transistor 3 respectively. Further, a fast switching diode 8 for by-passing reverse base currents is connected in parallel with the diodes 6 and 7 in a reverse direction in view of the gate of the MOS-FET 2.

Description is now made on the operation of the circuit shown in FIG. 1. When the voltage level of the driving pulse supplied between the gate and the source of the MOS-FET 2 from the driving circuit 1 exceeds the threshold voltage of the MOS-FET 2, the MOS-FET 2 is turned on. Further, when the level of the driving pulse exceeds the total (hereinafter referred to as gate-to-base voltage drop $V_{GB}$) of Zener breakdown voltage of the Zener diode 6, forward voltage drop of the diode 7 and base-to-emitter forward voltage drop of the bipolar transistor 3, the voltage driving pulse from the driving circuit 1 is supplied as the base current to the bipolar transistor 3 through the Zener diode 6 and the diode 7. The base current causes base-to-emitter saturation of the bipolar transistor 3, whereby the bipolar transistor 3 is turned on. The MOS-FET 2 is already in an ON state when the base current starts to flow to the bipolar transistor 3, and hence the amount of the voltage drop between the C/D terminal and the E/S terminal is small at this time. Therefore, the amount of the base current flowing between the base and the collector of the bipolar transistor 3 is considerably small in comparison with the general case or no current flows therebetween according to circumstances. Consequently, the bipolar transistor 3 performs the switching operation in a nonsaturation region (quasi-saturation or active operation region), whereby the storage time can be sufficiently reduced to less than several 10 nsec.

As the condition for the aforementioned turn-on mechanism, the MOS-FET 2 is required to be turned on before the turn-on of the bipolar transistor 3, and hence the gate-to-base voltage drop $V_{GB}$ must be higher than the gate-to-source threshold voltage of the MOS-FET 2.

In order to turn off the semiconductor device, a negative voltage pulse is supplied from the driving circuit 1 thereby to turn off both of the MOS-FET 2 and the bipolar transistor 3. As hereinabove described, the storage time of the bipolar transistor 3 is remarkably reduced, and substantially prevented in the circuit arrangement according to the present invention is the reverse base-to-collector current which generally flows upon the turn-off operation. Consequently, the reverse bias safe operating area is widened in comparison with that of the general bipolar transistor.

According to the present invention as hereinabove described, the MOS-FET and the bipolar transistor are driven by the same driving circuit, while the bipolar transistor is adapted to operate in the nonsaturation region (quasi-saturation or active operation region). Therefore, no means is required to match the operation timing of the MOS-FET and the bipolar transistor, whereby driving loss in the driving circuit is reduced and the semiconductor device can be miniaturized. Further, the storage time of the bipolar transistor is decreased while the reverse bias safe operating area is widened, whereby the semiconductor device is made operable at high frequencies under high current and voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device operable to be switched at high frequency, comprising, a field-effect transistor (2) having first and second electrodes and a control electrode, a bipolar transistor (3) having third, fourth and fifth electrodes, the fourth electrode being connected to said first electrode, and the fifth electrode being connected to said second electrode, at least a reference-voltage diode being connected in a reverse direction and at least a first diode being connected in a forward direction in view of said control electrode in a series manner in said order between said control electrode and said third electrode, a second diode being connected in parallel with a series-connected body of said reference-voltage diode and said first diode in said reverse direction in view of said control electrode, and a single driving circuit for supplying a switching signal provided between said control electrode and a junction between said second electrode and said fifth electrode.

2. A semiconductor device in accordance with claim 1, wherein said first electrode is a drain terminal, said second electrode is a source terminal, said third electrode is a base electrode, said fourth electrode is a collector electrode and said fifth electrode is an emitter electrode.

3. A semiconductor device in accordance with claim 1, wherein said bipolar transistor is an npn-type transistor.

4. A semiconductor device in accordance with claim 1 further including a third diode, said fourth electrode being connected with the cathode of said third diode, and said fifth electrode being connected with the anode of said third diode.

* * * * *